United States Patent
Fleischmann et al.

(10) Patent No.: US 7,714,641 B2
(45) Date of Patent: May 11, 2010

(54) VOLTAGE REGULATOR ARRANGEMENT

(75) Inventors: Peter Fleischmann, Munich (DE);
Gerhard Nebel, Immenstadt (DE);
Andreas Schlaffer, Munich (DE); Uwe Weder, Hallertau (DE)

(73) Assignee: Infineon Technologies AG, Neubiberg (DE)

( * ) Notice: Subject to any disclaimer, the term of this patent is extended or adjusted under 35 U.S.C. 154(b) by 694 days.

(21) Appl. No.: 10/946,579

(22) Filed: Sep. 20, 2004

(65) Prior Publication Data

US 2005/0057299 A1 Mar. 17, 2005

Related U.S. Application Data

(63) Continuation of application No. PCT/DE03/00814, filed on Mar. 13, 2003.

(30) Foreign Application Priority Data

Apr. 3, 2002 (DE) .............................. 102 14 941
May 28, 2002 (DE) .............................. 102 23 727

(51) Int. Cl.
*G05F 1/10* (2006.01)
(52) U.S. Cl. ..................... 327/540; 327/407; 327/541; 327/543; 327/544; 365/226
(58) Field of Classification Search ................. 327/143, 327/198, 535, 537, 538, 540, 541, 543, 544, 327/407; 365/226–229
See application file for complete search history.

(56) References Cited

U.S. PATENT DOCUMENTS

| 5,072,134 | A | | 12/1991 | Min | |
|---|---|---|---|---|---|
| 5,280,455 | A | * | 1/1994 | Kanaishi | 365/229 |
| 5,300,823 | A | * | 4/1994 | Ihara | 327/544 |
| 5,426,616 | A | * | 6/1995 | Kajigaya et al. | 365/226 |
| 5,493,234 | A | * | 2/1996 | Oh | 327/541 |
| 5,929,694 | A | | 7/1999 | Yanagawa et al. | |
| 6,097,113 | A | * | 8/2000 | Teraoka et al. | 307/125 |
| 6,140,805 | A | | 10/2000 | Kaneko et al. | |
| 6,275,096 | B1 | | 8/2001 | Hsu et al. | |
| 6,313,694 | B1 | * | 11/2001 | Sohn | 327/541 |
| 6,329,873 | B2 | * | 12/2001 | Morishita | 327/541 |
| 6,351,179 | B1 | | 2/2002 | Ikehashi et al. | |
| 6,661,279 | B2 | * | 12/2003 | Yabe | 327/546 |
| 6,831,502 | B1 | * | 12/2004 | Ooishi | 327/541 |
| 2002/0021611 | A1 | * | 2/2002 | Banba et al. | 365/226 |

* cited by examiner

*Primary Examiner*—Lincoln Donovan
*Assistant Examiner*—Khareem E Almo
(74) *Attorney, Agent, or Firm*—Dickstein, Shapiro, LLP.

(57) ABSTRACT

A voltage regulator arrangement having a first voltage regulator, whose input connection is connected to the supply potential connection and whose output connection is connected to a first supply potential connection of a circuit arrangement, with the first voltage regulator supplying the circuit arrangement with a supply voltage in a rest state. A second voltage regulator is also provided, whose input connection is connected to the supply potential connection, and whose output connection is connected to a second supply potential connection of the circuit arrangement, with the second voltage regulator supplying the circuit arrangement with a supply voltage during its normal operation.

11 Claims, 2 Drawing Sheets

VOLTAGE REGULATOR ARRANGEMENT

CROSS-REFERENCE TO RELATED APPLICATION

This application is a continuation of International Patent Application Serial No. PCT/DE03/00814, filed Mar. 13, 2003, which published in German on Oct. 9, 2003 as WO 03/083595, and is incorporated herein by reference in its entirety.

FIELD OF THE INVENTION

The invention relates to a voltage regulator arrangement having a voltage regulator which can be connected to the circuit arrangement and is intended for supplying this circuit arrangement.

BACKGROUND OF THE INVENTION

In the case of integrated circuits, a distinction is drawn between the internal supply voltage and the external supply voltage. The external supply voltage is applied to the input connection of the voltage regulator. The output connection of the voltage regulator, which can be connected to the circuit arrangement, applies the internal supply voltage to this circuit arrangement. The magnitude of the internal supply voltage is in this case governed by the requirements of the circuit arrangement. The internal supply voltage is normally lower than the external supply voltage. In consequence, the voltage regulator carries out the task of "transforming" the external supply voltage to the internal supply voltage. In this case, the internal supply voltage must be kept as constant as possible irrespective of voltage fluctuations of the external supply voltage, in order to make it possible to ensure the operation of the circuit arrangement that is to be supplied.

As the level of technological integration of the component of the circuit arrangement to be supplied increases, the internal supply voltage decreases. Since, at the same time, the maximum permissible external voltage range is extended on the basis of the predetermined standards (for example Global System for Mobile communication GSM or International Standard Organization ISO), the requirements for the voltage regulator to provide a constant internal supply voltage are becoming more stringent.

One problem in particular is to compensate for voltage spikes on the external supply voltage.

Firstly, the voltage spikes may increase as the external voltage range becomes wider. Secondly, a reduced internal supply voltage must be provided because of the technological integration level of the components of the circuit arrangement, as mentioned above. In this case, the same voltage fluctuations, that is to say their absolute value, produce greater effects as the internal supply voltage is decreased, since the relative change is then greater. Conventional voltage regulators are frequently therefore no longer able to generate a sufficiently constant internal supply voltage when major external voltage fluctuations occur and the required internal supply voltages are low.

In principle, two different types of voltage regulators are known from the prior art.

Firstly, there are integrated voltage regulators with p-channel series regulating transistors, which draw a small amount of current but are highly sensitive to voltage. The high voltage sensitivity is due to the fact that the external supply voltage is connected to the source connection of the p-channel series regulating transistor. p-channel series channel transistors are currently used in voltage regulators for integrated circuits for use in smart cards.

Furthermore, voltage regulators with n-channel series regulating transistors are known. These have little sensitivity to voltage, since the external supply voltage is connected to the drain connection of the n-channel series regulating transistor. However, this type has the disadvantage that the current draw is increased, due to the requirement for an additional oscillator and an additional voltage pump for driving the gate of the n-channel transistor. As a result of this, voltage regulators with an n-channel series regulating transistor require an increased current draw, particularly in a rest state. This results in contravention of the GSM and ISO standards mentioned above.

SUMMARY OF THE INVENTION

The present invention specifies a voltage regulator arrangement which is less susceptible to voltage spikes on the external supply voltage.

The voltage regulator arrangement according to the invention has a first voltage regulator whose input connection is connected to a supply potential connection and whose output connection can be connected to a first supply potential connection of a circuit arrangement. In this case, the first voltage regulator supplies the circuit arrangement with a supply voltage in its rest state. Furthermore, a second voltage regulator is provided, whose input connection is connected to the supply potential connection. The output connection of the second voltage regulator can be connected to a second supply potential connection of the circuit arrangement, with the second voltage regulator supplying the circuit arrangement with a supply voltage during its normal operation.

In comparison to conventional voltage regulator arrangements, which have only one voltage regulator, two voltage regulators are provided for the voltage regulator arrangement according to the invention. In this case, the first voltage regulator supplies the circuit arrangement in a rest state, while the other voltage regulator applies a supply voltage to the circuit arrangement during its normal operation.

It is thus possible to use optimized voltage regulators for the respective state of the circuit arrangement (rest state or normal operation) so that, firstly, a drastic reduction can be achieved in the sensitivity to voltage spikes on the external supply voltage and, secondly, a low current draw can be achieved in the rest state. Particularly when using the voltage regulator arrangement in battery-powered applications, this results in a very much longer standby time than with conventional arrangements.

In one preferred refinement, the first voltage regulator has a series regulating transistor of the first conductance type. The second voltage regulator, in contrast, preferably has a series regulating transistor of the second conductance type. This makes it possible to optimize one voltage regulator for a low current draw, while the other has little voltage sensitivity to voltage spikes on the external supply voltage.

The first voltage regulator expediently as a p-channel series regulating transistor, which results in only a low current draw and which can thus be used advantageously in the rest state.

The second voltage regulator preferably has means for producing a high voltage. The second voltage regulator, which preferably has an n-channel series regulating transistor, thus ensuring little voltage sensitivity during normal operation, can then be connected by its drain connection to the external supply voltage. In order to allow this n-channel series regulating transistor to be switched on, a voltage which is higher than the source voltage must, however, be applied to its gate connection. This is provided by the means for producing a high voltage.

The means for producing the high voltage preferably comprises a charge pump and an apparatus for producing an oscillating signal. Arrangements such as these are known by the expression "charge pump". These charge pumps comprise an arrangement of capacitors and diodes in the form of a cascade. The oscillating signal charges the capacitors in the charge pump further with each clock cycle, so that the necessary high voltage can be provided to the gate connection of the n-channel series regulating transistor.

The apparatus for producing an oscillating signal preferably has an oscillator which is connected between the output connection of the second voltage regulator and the charge pump, is operated with the voltage that is produced at the output connection, and applies a signal to the charge pump during normal operation of the circuit arrangement.

Furthermore, one refinement provides for the apparatus for producing an oscillating signal to have a level shifter which is connected between the output connection of the first voltage regulator and the charge pump, is operated by an external clock signal and applies the signal to the charge pump for as long as the oscillator cannot yet be fed by the second voltage regulator. The level shifter is used to shift the amplitude of the clock signal to a predetermined value.

The charge pump, which requires an oscillating control signal to produce the high voltage, thus has the oscillating control signal applied to it from two different apparatuses. Until the second voltage regulator produces a stable output voltage, the oscillating signal is provided by the level-shifted external clock. As soon as the second voltage regulator has stabilized at its predetermined output voltage, another oscillator is operated with this output voltage, and its oscillating signal is then supplied to the charge pump. The level-shifted external clock is no longer required after this point in time. In order to allow this switching, a switching element is therefore provided, whose output is connected to the charge pump and whose inputs are connected to the level-shifted external clock and to the oscillator which is operated by the output voltage of the second voltage regulator. The switching element is switched as a function of the voltage which is produced at the output connection of the second voltage regulator.

At least one further second voltage regulator, which is used for supply further circuit arrangements, is provided in a further refinement of the invention. These circuit arrangements may comprise any desired functional elements which differ from the circuit arrangement mentioned initially.

The second voltage regulators preferably have a reference voltage applied to them from a voltage reference circuit. The voltage reference circuit preferably has a voltage regulator with a series regulating transistor of the second conductance type, and is fed by the means for producing a high voltage during normal operation. A band gap reference, a so-called band gap circuit, may be used as the voltage reference circuit.

When the circuit arrangement or further circuit arrangements is or are in the rest state, all the voltage regulators are preferably switched off by series regulating transistors of the second conductance type. In consequence, only the first voltage regulator is still active in the rest state and applies a supply voltage to the circuit arrangement and, if necessary, also to the further circuit arrangements. Since, on the basis of the idea of the invention, the first voltage regulator has a low current draw, the integrated overall circuit, comprising the voltage regulator arrangement and the circuit arrangement or circuit arrangements, requires an extremely low current draw.

BRIEF DESCRIPTION OF THE DRAWINGS

The invention will be explained in more detail with reference to the following figures.

DETAILED DESCRIPTION OF THE PREFERRED MODE OF THE INVENTION

Figure 1:
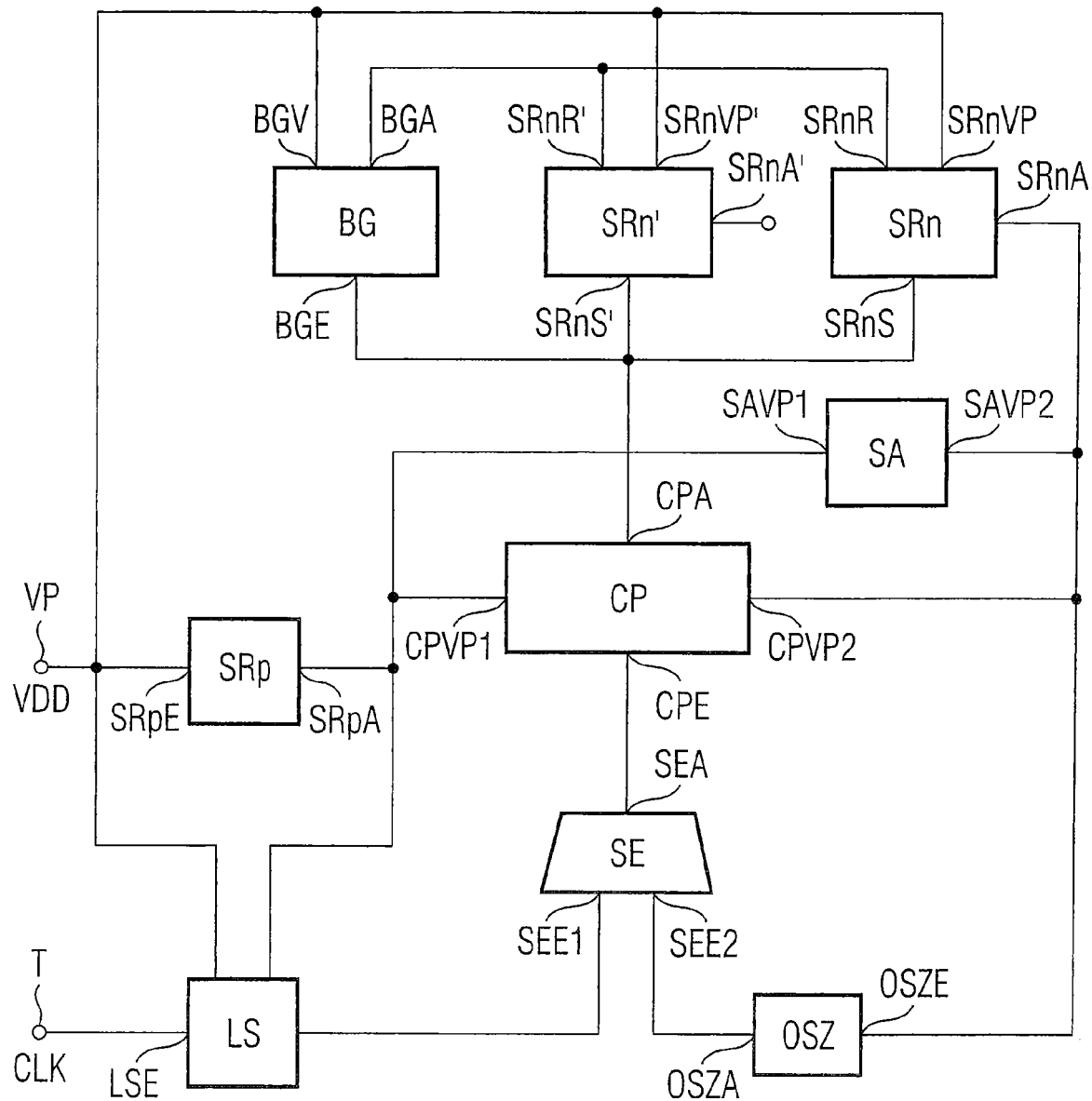
FIG. 1 shows an integrated circuit with a voltage regulator according to the invention.

FIG. 1 shows an integrated circuit with a voltage regulator according to the invention, and with a circuit arrangement.

Figure 2:
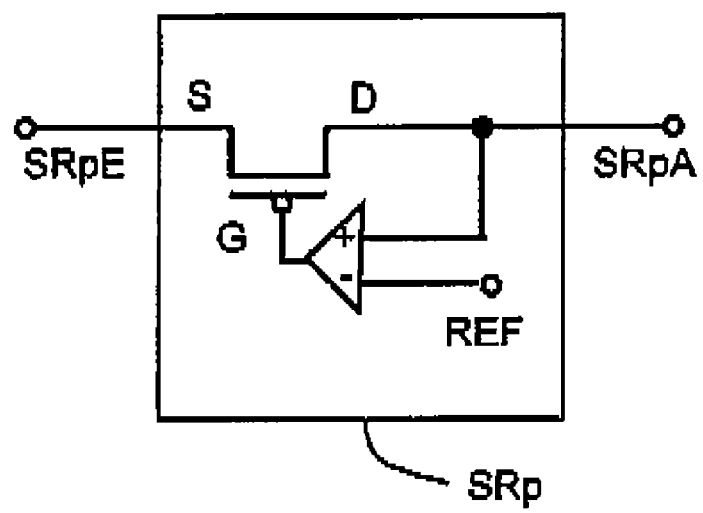
FIG. 2 shows in detail the first voltage regulator of FIG. 1.

A first voltage regulator SRp, which is shown in detail in FIG. 2, is connected by one input connection SRpE to a supply potential connection VP, to which a supply potential VDD is applied. An output connection SRpA is connected to a first supply potential connection SAVP1 of a circuit arrangement SA. The first voltage regulator SRp has a p-channel series regulating transistor, and supplies the circuit arrangement SA with a supply voltage in its rest state.

Referring to the first voltage regulator of FIG. 2, the voltage Vgs between gate G and source S which controls the resistance of the transistor is formed by the source S being connected to supply voltage at SRpE. Any variations in the supply voltage will therefore lead to changes in Vgs and in the resistance, causing a high sensitivity to supply voltage spikes. REF is a reference voltage for the comparator and is equal to the output at SRpA to be achieved. REF can be supplied by a well-known means.

Figure 3:
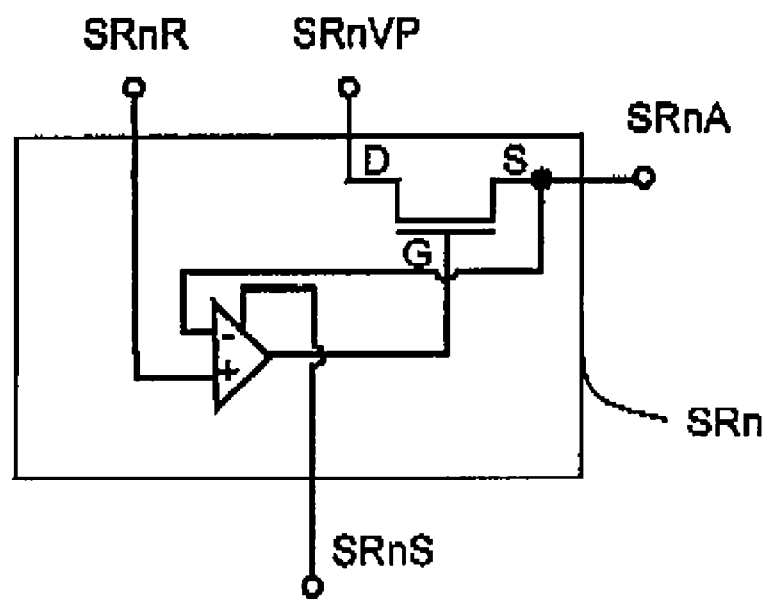
FIG. 3 shows in detail the second voltage regulator of FIG. 1.

The circuit arrangement SA furthermore has a second supply potential connection SAVP2, which is connected to an output connection SRnA of a second voltage regulator SRn, which is shown in detail in FIG. 3. On the input side, the second voltage regulator SRn likewise has the supply potential VDD applied to its input connection SRnVP. The second voltage regulator SRn has an n-channel series regulating transistor. In these voltage regulators, the drain connection of the n-channel regulating transistor is normally connected to the external supply voltage VDD. In consequence, the voltage regulator SRn requires a means for producing a high voltage, which shifts the gate connection of the series regulating transistor to a higher potential with respect to the internal supply potential SRnA that is to be produced.

For this purpose, a control signal connection SRnS of the second voltage regulator SRn is connected to the output connection CPA of a charge pump CP. This charge pump CP is an arrangement of capacitors and diodes in the form of a cascade. The charge pump CP obtains its supply voltage via a first supply potential connection CPVP1, which is connected to the output of the first voltage regulator SRp, or alternatively via a second supply potential connection CPVP2, which is connected to the output SRnA of the second voltage regulator SRn. The details of the method of operation and the time at which the charge pump CP is supplied via which supply potential connection CPVP1 or CPVP2 will become evident from the description, which follows further below, of the method of operation of the voltage regulator arrangement.

Referring to the second voltage regulator of FIG. 3, the voltage Vgs is formed by the source S being connected to the regulated output at SRnA. Due to the regulation of the source S, Vgs does not experience any spikes and is insensitive to spikes in the supply voltage input at SRnVP. However, for this arrangement a voltage for the gate G is required which is higher than the supply voltage. This is achieved by powering the comparator with a higher voltage through SRnS, as is also shown in FIG. 1. SRnR is used as a reference voltage for the voltage which the output SRnA is to have. While having lower spike sensitivity this circuit requires a high voltage generator and consumes more power.

In order to produce a high voltage, the charge pump CP also requires an oscillating signal. This is supplied to it via an input connection CPE, either from an oscillator OSZ or as a level-shifted external clock.

The oscillator OSZ is connected on the input side to the output connection SRnA of the second voltage regulator SRn. The output connection OSZA of the oscillator OSZ is connected to a second input connection SEE2 of a switching element SE, which has, on the output side, a connection for the input connection CPE of the charge pump CP. The oscillator OSZ is thus operated with the voltage produced at the output connection SRnA of the second voltage regulator.

In contrast, the level shifter LS is operated via an input connection LSE by a clock signal CLK which is applied to a clock signal connection T of the integrated circuit. The level shifter LS is also connected to the output SRpA and to the input SRpE of the first voltage regulator SRp. On the output side, the level shifter is connected to a first input connection SEE1 of the switching element SE. Alternatively, instead of the level-shifted external clock, an oscillator which is supplied with the output voltage SRpA from the first voltage regulator SRp could generate this clock, and could be connected on the output side to the first input connection SEE1.

The switching element SE is a multiplexer, which is controlled as a function of the voltage which is produced at the output connection SRnA of the second voltage regulator SRn.

The second voltage regulator SRn also has a reference voltage connection SRnR, which is connected to an output connection BGA of a voltage reference circuit BG. The voltage reference circuit may, for example, be a band gap reference or band gap. The voltage reference circuit BG obtains its supply voltages via a supply potential connection BGV, to which the supply potential VDD at the supply potential connection VP is applied, and via an input connection BGE which is connected to the output connection CPA of the charge pump CP.

The method of operation of the voltage regulator arrangement according to the invention will be explained in more detail in the following text.

When the external supply voltage VDD is applied, a voltage which corresponds approximately to the supply voltage of the circuit arrangement SA is generated at the output SRpA of the first voltage regulator SRp. If the integrated circuit is intended to be switched from its rest state to its normal operation, then the voltage which is produced at the output SRpA is supplied via the supply potential connection CPVP1 to the charge pump CP.

Prior to this, a clock signal CLK is applied to the clock signal connection T, so that the level shifter LS can be provided with an oscillating signal via the switching element SE of the charge pump CP. In consequence, the charge pump CP can produce a high voltage at its output connection CPA, and this high voltage is provided for the second voltage regulator SRn, at its control signal connection SRnS. The high voltage which is produced at the output connection CPA is also made available to the voltage reference circuit BG, via the input connection BGE. The second voltage regulator SRn is thus able to form an output voltage, which it makes available via its output connection SRnA.

The output voltage which is produced by the second voltage regulator SRn is made available via the second supply potential connection SAVP2 of the circuit arrangement SA. The first voltage regulator SRp, which is highly sensitive to voltage owing to its p-channel transistor, is no longer required after this point in time.

The output voltage which is produced by the second voltage regulator SRn is also made available to the oscillator OSZ. The switching element SE identifies the output voltage, which is now stable, at the output connection SRnA and switches to the oscillator OSZ, so that the oscillating signal is now no longer provided for the charge CP via the level shifter LS, but via the oscillator OSZ.

In the rest state, the oscillator OSZ, the charge pump CP and all the voltage regulators which have an n-channel regulating transistor, that is to say all the second voltage regulators, and the voltage reference circuit are switched off. The voltage is supplied to the circuit arrangement SA in this rest state by means of the first voltage regulator SRp, which therefore now has to supply only a relatively small current and which, on the other hand, itself draws only a very small current.

The voltage regulator according to the invention makes it possible to drastically reduce the susceptibility to voltage spikes during normal operation, while ensuring an extremely low current draw in the rest state. During normal operation, the voltage fluctuations are drastically reduced by exclusively using voltage regulators with n-channel series regulating transistors. In the rest state, the current is drawn only by one p-channel series regulating transistor. Oscillators, charge pumps and n-channel series regulating transistors are, in contrast, switched off. Switching to the internal oscillator OSZ results in the integrated circuit supplying itself. Thus, there is no further connection to external connections other than the drain connections of the n-channel series regulating transistors. This results in interference voltage suppression which is very good from the start.

The voltage regulator arrangement can furthermore have further second voltage regulators SRn in addition to the second voltage regulator SRn. A control signal connection SRnS is then likewise connected to the output connection CPA of the charge pump CP. A supply potential connection SRnVP is connected to the output connection BGA of the voltage reference circuit BG. An output connection SRnA can be connected to a further circuit arrangement (which is not shown in the figures). This may carry out other functional tasks. The further second voltage regulator operates and is driven in the manner described above.

The invention claimed is:

1. A voltage regulator arrangement comprising:
an initial supply potential connection, to which a supply potential is applied;
a first voltage regulator, whose input connection is connected to the initial supply potential connection and whose output connection is connected to a first supply potential connection of a circuit arrangement, with the first voltage regulator supplying the circuit arrangement with a supply voltage in a rest state,
wherein the first voltage regulator is optimized for a low current consumption, and has a p-channel series regulating transistor with the source connection connected to the initial supply potential connection;
a second voltage regulator, whose input connection is connected to the initial supply potential connection, and whose output connection is connected to a second supply potential connection of the circuit arrangement, with the second voltage regulator supplying the circuit arrangement with a supply voltage during its normal operation, wherein the second voltage regulator is optimized for a low sensitivity to spikes of the supply potential, and has an n-channel series regulating transistor; and a high voltage producer, which supplies the second voltage regulator with a potential that is higher than the supply potential.

2. The voltage regulator arrangement as claimed in claim 1, wherein the first voltage regulator has a series regulating transistor of a first conductance type.

3. The voltage regulator arrangement as claimed in claim 1, wherein the second voltage regulator has a series regulating transistor of a second conductance type.

4. The voltage regulator arrangement as claimed in claim 1, wherein at least one further second voltage regulator is provided, and supplies further circuit arrangements.

5. The voltage regulator arrangement as claimed in claim 4, wherein the at least one second voltage regulator has a reference voltage applied thereto from a voltage reference circuit.

6. The voltage regulator arrangement as claimed in claim 5, wherein the voltage reference circuit has a third voltage regulator with a series regulating transistor of a second conductance type and, during normal operation, is fed from the high voltage producer.

7. The voltage regulator arrangement as claimed in claim 1, wherein, when the circuit arrangement is in a rest state, the first and second voltage regulators are switched off by a series regulating transistor of the second conductance type.

8. The voltage regulator arrangement as claimed in claim 3, wherein the high voltage producer comprises a charge pump and an apparatus that produces an oscillating signal.

9. The voltage regulator arrangement as claimed in claim 8, wherein the apparatus that produces the oscillating signal has an oscillator, which is connected between an output connection of the second voltage regulator and the charge pump, is operated with a voltage which is produced at the output connection and applies a signal to the charge pump during normal operation of the circuit arrangement.

10. The voltage regulator arrangement as claimed in claim 8, wherein the apparatus that produces the oscillating signal has a level shifter, which is connected between the output connection of the first voltage regulator and the charge pump, is operated by an external clock signal and applies a signal to the charge pump for as long as the oscillator is not fed by the second voltage regulator.

11. The voltage regulator arrangement as claimed in claim 1, wherein the drain connection of the n-channel series regulating transistor is connected to the initial supply potential connection.

\* \* \* \* \*